(12) United States Patent
de Ridder et al.

(10) Patent No.: US 10,858,738 B2
(45) Date of Patent: Dec. 8, 2020

(54) WAFER BOAT COOLDOWN DEVICE

(71) Applicant: ASM International N.V., Almere (NL)

(72) Inventors: Chris G. M. de Ridder, Almere (NL); Lucian C. Jdira, Nieuw Vennep (NL); Bartholomeus Hans Louis Lindeboom, Blaricum (NL)

(73) Assignee: ASM INTERNATIONAL N.V., Almere (NL)

( * ) Notice: Subject to any disclaimer, the term of this patent is extended or adjusted under 35 U.S.C. 154(b) by 132 days.

(21) Appl. No.: 16/366,202

(22) Filed: Mar. 27, 2019

(65) Prior Publication Data
US 2019/0301018 A1    Oct. 3, 2019

Related U.S. Application Data

(60) Provisional application No. 62/649,867, filed on Mar. 29, 2018.

(51) Int. Cl.
*C23C 16/46* (2006.01)
*C23C 16/458* (2006.01)

(52) U.S. Cl.
CPC ........ *C23C 16/466* (2013.01); *C23C 16/4588* (2013.01)

(58) Field of Classification Search
CPC ... C23C 16/466; C23C 16/458; C23C 16/463; H01L 21/67011; H01L 21/67109; H01L 21/67303; H01L 21/6732
See application file for complete search history.

(56) References Cited

U.S. PATENT DOCUMENTS

| | | | | |
|---|---|---|---|---|
| 3,850,417 A * | 11/1974 | Elorza | ................... | C21D 9/663 266/254 |
| 5,254,170 A * | 10/1993 | Devilbiss | ............ | F27B 17/0025 118/719 |
| 6,005,225 A * | 12/1999 | Kowalski | .......... | H01L 21/67098 219/390 |
| 7,059,849 B2 * | 6/2006 | Sakata | ...................... | F27B 5/04 432/233 |
| 8,148,271 B2 * | 4/2012 | Ueno | ................ | H01L 21/67769 438/748 |
| 10,283,379 B2 * | 5/2019 | Schaller | ............ | H01L 21/67109 |
| 2013/0065189 A1 * | 3/2013 | Yoshii | .................. | C23C 16/481 432/9 |

FOREIGN PATENT DOCUMENTS

JP             3207402 B2 *  9/2001
WO     WO-2019103613 A1 *  5/2019   ....... H01L 21/67769

* cited by examiner

*Primary Examiner* — Gregory A Wilson
(74) *Attorney, Agent, or Firm* — Preti Flaherty Beliveau & Pachios LLP

(57) ABSTRACT

A wafer boat cooldown device comprising a bottom plate and a rotatable table that is rotatable between a number of index positions. The rotatable table comprises at least two wafer boat positions for supporting a wafer boat. A vertically extending wall structure is mounted on the rotatable table and creates, at each wafer boat position, a wafer boat chamber having a gas supply area and a gas discharge area. The wafer boat cooldown device further comprises a plenum chamber which extends under the bottom plate. The plenum chamber accommodates at least one gas/liquid heat exchanger.

18 Claims, 5 Drawing Sheets

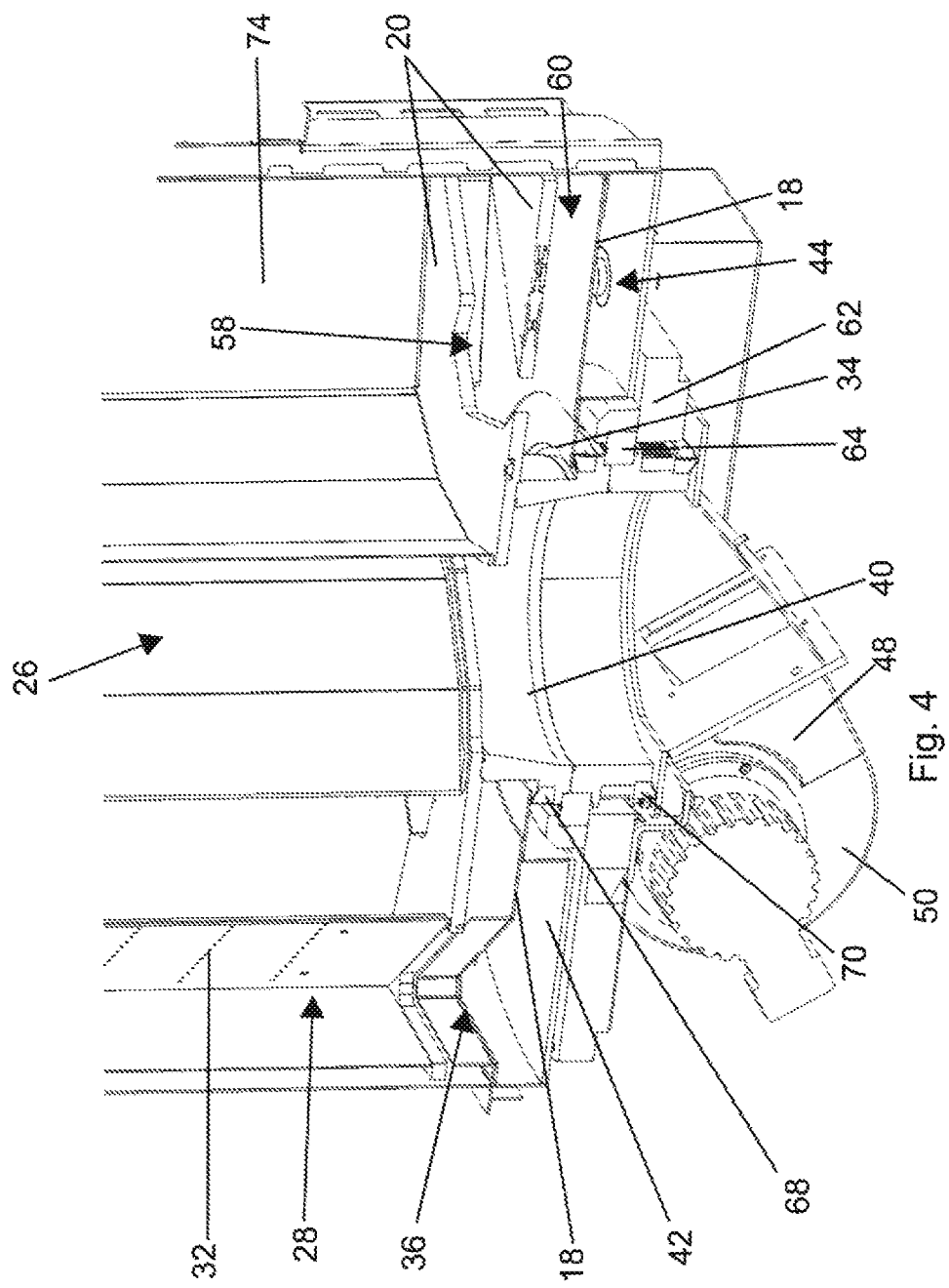

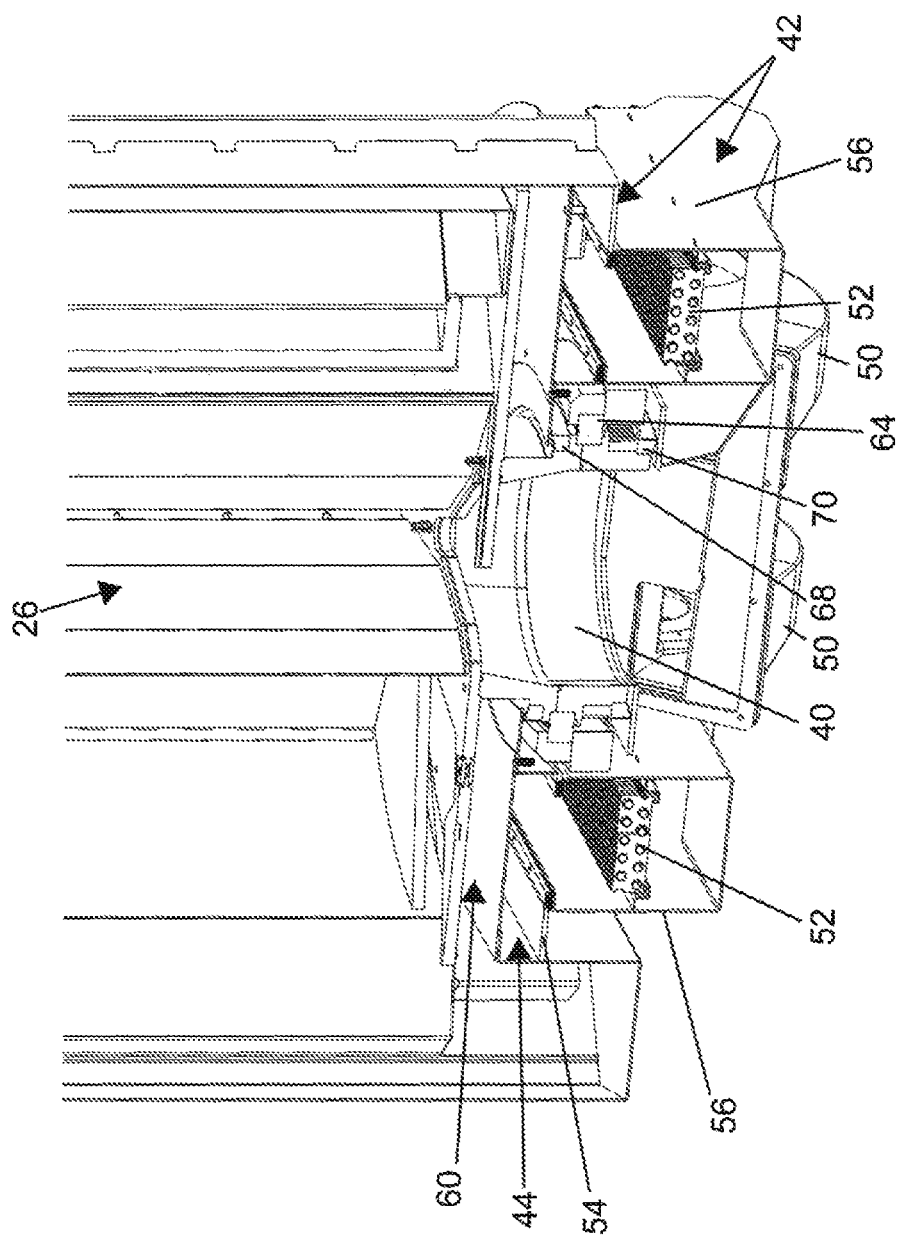

WAFER BOAT COOLDOWN DEVICE

This patent application claims priority from U.S. Provisional Patent Application No. 62/649,867, filed Mar. 29, 2018, the disclosure of which is incorporated by reference herein in its entirety.

FIELD

The invention relates to a wafer boat cooldown device, configured to be positioned under a process chamber of a vertical batch furnace for processing wafers accommodated in a wafer boat.

BACKGROUND

EP 1 341 213 and US 2012 213613 both describe an apparatus for treating wafers which also comprises a wafer boat cooldown device. The known devices include a carousel or rotatable table on which a plurality of wafer boats can be positioned. By rotating the carousel or rotatable table, the wafer boats can be brought from an unloading and/or loading position to a treatment position under a processing chamber of the vertical batch furnace. A wafer boat lift is provided at the treatment position for lifting a wafer boat into the process chamber of the vertical batch furnace or for retrieving a wafer boat from the process chamber. During treatment in the process chamber, the wafer boat and the wafers accommodated therein are raised in temperature. With the carousel or rotatable table, a wafer boat which has been removed from the process chamber can be brought to a cooling position where a wafer boat can cool down following a treatment in the process chamber. Effective cooling of the wafers and the wafer boat may be required to improve the productivity of the system.

SUMMARY

It is an object to provide a wafer boat cooldown device which cools the wafers.

To that end, there is provided a wafer boat cooldown device according to claim 1. More particularly, the invention provides a wafer boat cooldown device configured to be positioned under a process chamber of a vertical batch furnace for processing wafers accommodated in a wafer boat. The wafer boat cooldown device comprises:

a bottom plate;

a rotatable table comprising at least two wafer boat positions for supporting a wafer boat, the rotatable table being rotatable above the bottom plate around a central vertical axis; and a vertically extending wall structure mounted on the rotatable table and which creates, at each wafer boat position, a vertically extending wafer boat chamber.

The vertically extending wall structure comprises:

a gas supply area comprising a plurality of gas supply openings; and, a gas discharge area comprising a plurality of gas discharge openings.

The wafer boat cooldown device further comprises a duct which extends through a central gas opening in the bottom plate and is in fluid communication with the gas supply or discharge openings.

The bottom plate has a number of bottom plate openings which, when the rotatable table is in one of a number of index positions, are in fluid communication with the gas supply or discharge openings.

The wafer boat cooldown device further comprises a plenum chamber housing having plenum chamber walls which create a plenum chamber which extends under the bottom plate, at least partially around the duct. The number of bottom plate openings in the bottom plate are in fluid communication with the plenum chamber. The plenum chamber has at least one plenum chamber opening.

The wafer boat cooldown device further comprises:

a recirculation channel extending from the at least one plenum chamber opening to the duct and comprising at least one gas blower; and at least one gas/liquid heat exchanger positioned in the plenum chamber.

Because the gas/liquid heat exchanger is positioned in a stationary part of the wafer boat cooldown device, any liquid connections (inlet/outlet) to and from the gas/liquid heat exchanger can be fixed connections. From a manufacturing and maintenance point of view this is advantageous over a solution in which each wafer boat chamber on the rotating table or carousel has its own gas/liquid heat exchanger which is placed on the rotatable table. Although such a solution is attractive in that it immediately cools hot gas exiting a wafer boat chamber and thus prevents heating of other parts of the cooldown device, such a solution requires rotatable liquid connections for the supply and discharge of liquid to the gas/liquid heat exchangers. These rotatable liquid connections require regular maintenance and the risk of leakage of cooling liquid is much higher than with fixed connections as in the solution according to the invention. Additionally, fixed liquid connections are cheaper and easier to install. Another disadvantage of a solution in which each wafer boat chamber on the rotating table or carousel has its own gas/liquid heat exchanger which is placed on the rotatable table, is that at least one of the gas/liquid heat exchangers is not effective because the wafer boat chamber associated with that gas/liquid heat exchanger is already cooled down because it has already been in a cooldown position.

An advantage over a solution in which each wafer boat chamber on the rotatable table or carousel has its own gas/liquid heat exchanger which is placed on the rotatable table is that the gas/liquid heat exchanger is more effective. This has two reasons.

Firstly, the gas flows leaving the different wafer boat chambers are combined in the plenum chamber and jointly cooled, making the gas/liquid heat exchanger(s) more effectively used.

Secondly, all the gas coming from the wafer boat chambers has to pass the at least one gas/liquid heat exchanger because no bypass of gas around the gas/liquid heat exchanger is possible so that an optimal efficiency is obtained for cooling the recirculating gas. Such bypass is possible with a solution in which each wafer boat chamber on the rotatable table or carousel has its own gas/liquid heat exchanger which is placed on the rotatable table. In such a solution, gas may bypass the gas/liquid heat exchanger and, for example, flow via a lift arm opening in the bottom of the rotating table out of the wafer boat chamber.

The present invention also provides a vertical batch furnace assembly according to claim 19. More particularly, the invention provides a vertical batch furnace assembly comprising:

a process chamber for processing wafers accommodated in a wafer boat;

a wafer boat cooldown device according to the invention, wherein the wafer boat cooldown device is positioned under the process chamber; and a vertical wafer boat lift assembly configured to transfer a wafer boat from the wafer boat cooldown device to the process chamber and vice versa.

The vertical batch furnace according to the invention has the same advantages as those which have been described above in relation to the wafer boat cooldown device according to the invention.

Various embodiments are claimed in the dependent claims, which will be further elucidated with reference to an example shown in the figures. The embodiments may be combined or may be applied separate from each other.

BRIEF DESCRIPTION OF THE FIGURES

FIG. 4 shows cross-sectional perspective view of a lower part of the wafer boat cooldown device of FIG. 1;

FIG. 5 shows another cross-sectional perspective view of a lower part of the wafer boat cooldown device of FIG. 1.

DETAILED DESCRIPTION OF THE FIGURES

Figure 1:
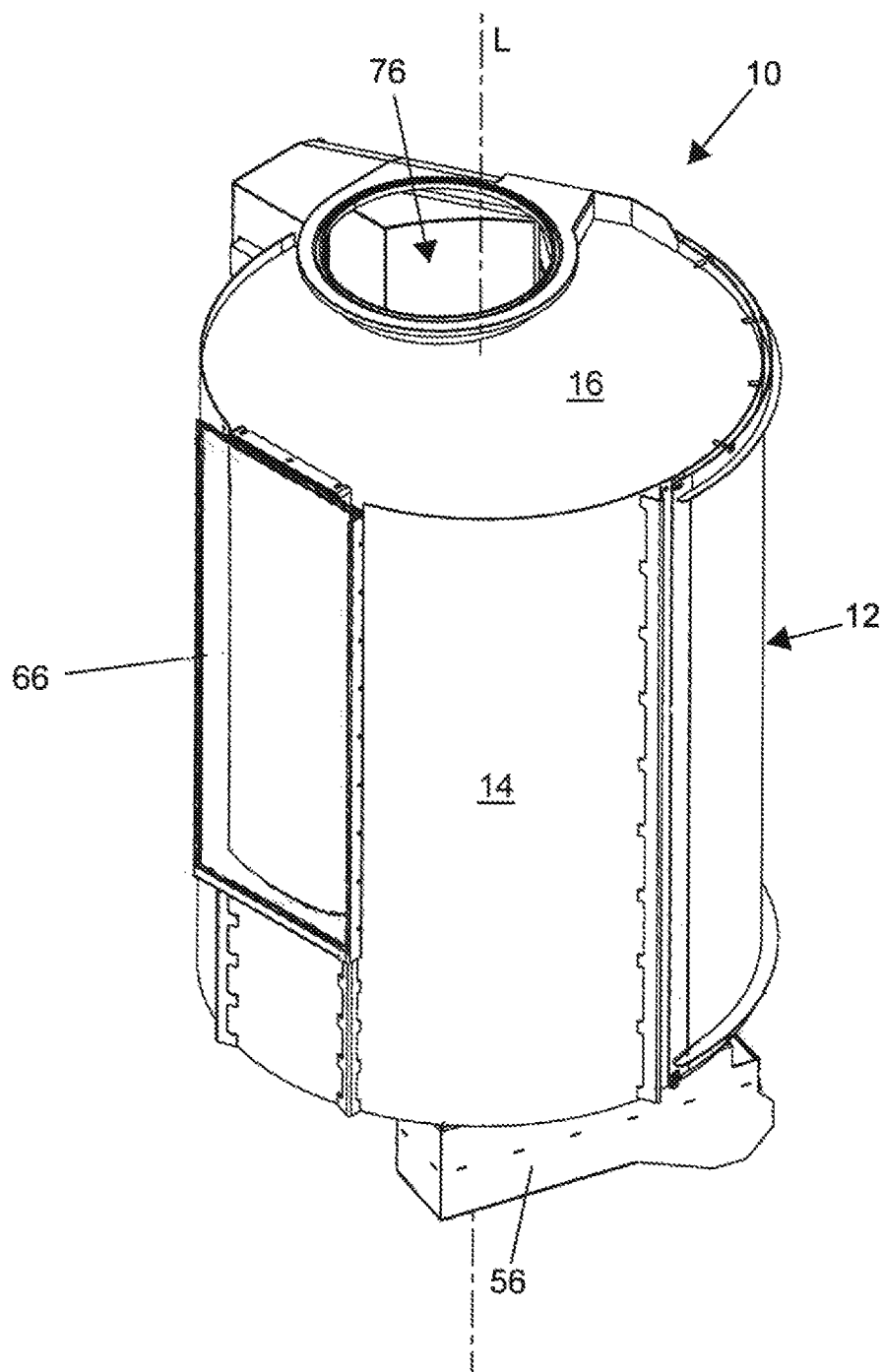
FIG. 1 shows a perspective view slightly from above of an example of the wafer boat cooldown device according to the current invention.
Figure 2:
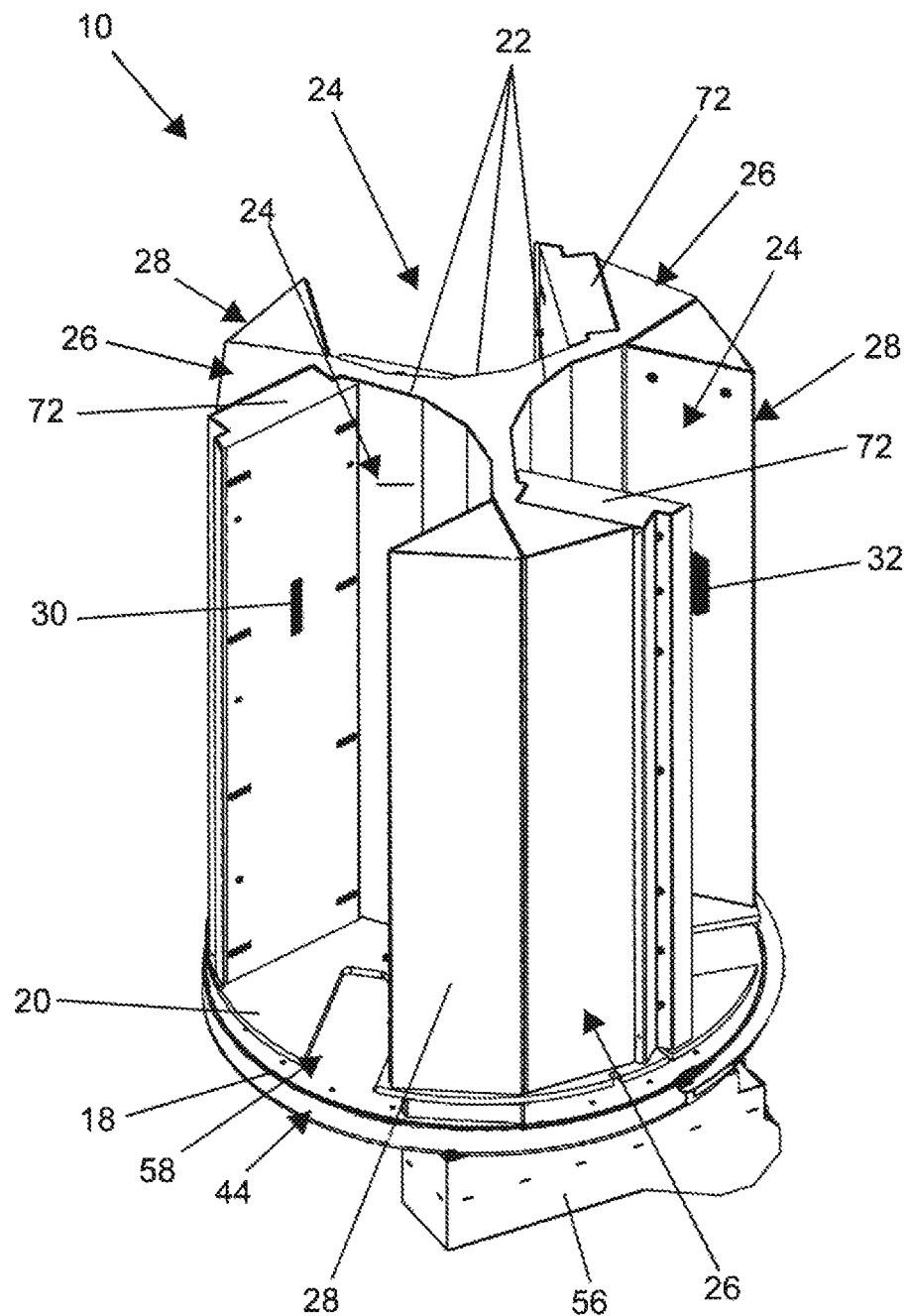
FIG. 2 shows the wafer boat cooldown device of FIG. 1 in which the housing is partly removed.
Figure 3:
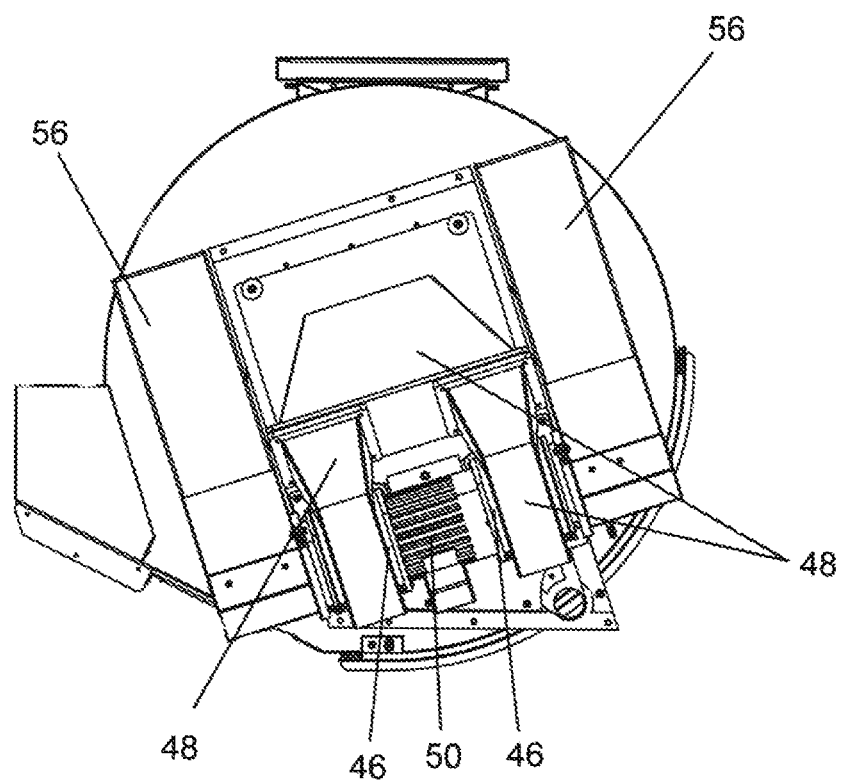
FIG. 3 shows a bottom view of the wafer boat cooldown device of FIG. 1.

In this application similar or corresponding features are denoted by similar or corresponding reference signs. The description of the various embodiments is not limited to the example shown in the figures and the reference numbers used in the detailed description and the claims are not intended to limit the description of the embodiments, but are included to elucidate the embodiments by referring to the example shown in the figures.

In the most general term the invention provides a wafer boat cooldown device 10, configured to be positioned under a process chamber of a vertical batch furnace for processing wafers accommodated in a wafer boat. The wafer boat cooldown device 10 comprises a bottom plate 18, and a rotatable table 20. The rotatable table 20 may be rotatable between a number of index positions. The rotatable table 20 comprises at least two wafer boat positions for supporting a wafer boat, the rotatable table 20 being rotatable above the bottom plate 18 around a central vertical axis L. The wafer boat cooldown device 10 additionally comprises a vertically extending wall structure 22 mounted on the rotatable table 20 and which creates, at each wafer boat position, a vertically extending wafer boat chamber 24. The vertically extending wall structure 22 comprises a gas supply area comprising a plurality of gas supply openings 30, and a gas discharge area comprising a plurality of gas discharge openings 32. The wafer boat cooldown device 10 further comprises a duct 40 which extends through a central gas opening 34 in the bottom plate 18 and is in fluid communication with the gas supply or discharge openings 30, 32. The bottom plate 18 has a number of bottom plate openings 36 which, when the rotatable table 20 is in one of the number of index positions, are in fluid communication with the gas supply or discharge openings 30, 32. The wafer boat cooldown device 10 further comprises a plenum chamber housing 42 having plenum chamber walls which create a plenum chamber 44 which extends under the bottom plate 18, at least partially around the duct 40. The number of bottom plate openings 36 in the bottom plate 18 are in fluid communication with the plenum chamber 44. The plenum chamber 44 has at least one plenum chamber opening 46. The wafer boat cooldown device 10 further comprises a recirculation channel 48 extending from the at least one plenum chamber opening 46 to the duct 40 and including at least one gas blower 50. The wafer boat cooldown device 10 comprises at least one gas/liquid heat exchanger 52 positioned in the plenum chamber 44. The at least one gas/liquid heat exchanger 52 may be configured for cooling the gas which is discharged from at least one of the wafer boat chambers 24.

The effects and advantages of the wafer boat cool down device 10 have been described in the summary section and these effects and advantages are inserted here by reference. Preferably the plurality of gas supply openings 30 are in fluid communication with the duct 40. Gas will than flow form the duct 40 to the inlet openings 30, from the inlet openings 30 through the wafer boat chamber 24 to the gas discharge openings 32, from the gas discharge openings 32 to the bottom plate openings 36, from the bottom plate openings 36 though the plenum chamber 44 to the plenum chamber opening 46, and from the plenum chamber opening 46 though the recirculation channel 48 back to the duct 40. But the duct 40 can also be fluidly connected to the gas discharge openings 32, in which case the gas will flow in an opposite direction within the plenum chamber 46 and recirculation channel 48.

The plurality of gas supply openings 30 may be distributed in the vertically extending wall structure 22 at least along the vertical direction over substantially the entire height of the vertically extending wall structure 22. Additionally or alternatively the plurality of gas discharge openings 32 may also be distributed in the vertically extending wall structure 22 at least along the vertical direction over substantially the entire height of the vertically extending wall structure 22.

In an embodiment of the invention, the plenum chamber housing 42 includes at least one heat exchanger housing 56. The at least one gas/liquid heat exchanger 52 is accommodated in an associate one of the at least one heat exchanger housing 56. Also, the at least one plenum chamber opening 46 is provided in the at least one heat exchanger housing 56, so that the gas which is discharged from at least one of the wafer boat chambers 24 flows along the at least one gas/liquid heat exchanger 52 when flowing to the recirculation channel 48 or to the number of bottom plate openings 36.

For an optimum efficiency of the at least one gas/liquid heat exchanger 52, the plenum chamber 44 does not only need to accommodate the gas/liquid heat exchanger 52, but the flow of the gas within the plenum chamber 44 should be directed along the gas/liquid heat exchanger 52 as best as possible. This flow of the gas is determined by the shape of the plenum chamber 44. In this embodiment the plenum chamber 44 is not strictly an annular disk, but comprises the at least one heat exchanger housing 56 in which the gas/liquid heat exchanger 52 is accommodated. In the example shown in the figures, the plenum chamber 44 has two heat exchanger housings 56. But in alternative embodiments, one or more than two heat exchanger housings 56 may be provided. The heat exchanger housing 56 can be adjacent to a bottom wall 54 of the plenum chamber 44, protruding down from a bottom side of said bottom wall 54. The advantage of a distinct heat exchanger housing 56 is that the gas/liquid heat exchanger 52 can be fitted snugly within its heat exchanger housing 56, so that gas flowing though the heat exchanger housing 56 must past along the gas/liquid heat exchanger 52. Because of the placement of the plenum chamber opening 46, the gas has to flow though the heat exchanger housing 56 to reach the recirculation channel 48 or the number of bottom plate openings 36, depending on the direction of flow of the gas. With a snugly fitted gas/liquid heat exchanger 52 in the heat exchanger housing 56, the cooling efficiency is thus optimized.

Multiple heat exchanger housings 56 are possible, for example two heat exchanger housings 56 as shown in the figures. With multiple heat exchanger housings, each heat exchanger housing 56 is provided with at least one of the at least one gas/liquid heat exchangers 52 and at least one of the at least one plenum chamber openings 46. Preferably each heat exchanger housing 56 accommodates one gas/liquid heat exchanger 52, and is provided with one plenum chamber opening 46. Each plenum chamber opening 46 connects each respective heat exchanger housing 56 with the recirculation channel 48, so that in each heat exchanger housing 56, the gas which is discharged from at least one of the wafer boat chambers 24 is forced to flow along the gas/liquid heat exchanger 52.

In an embodiment of the invention, for each wafer boat chamber 24 the gas supply area is opposite the gas discharge area, so that gas supplied via the plurality of gas supply openings 30 to the respective wafer boat chamber 24 substantially horizontally crosses the wafer boat chamber 24 when flowing to the plurality of gas discharge openings 32 of the associated wafer boat chamber 24.

This substantially horizontal flow of gas provides a near laminar flow pattern which is helpful for an efficient cooling of a wafer boat within the wafer boat chamber 24.

In an embodiment of the invention, the wafer boat cooldown device 10 may further comprise a gas supply duct 26, which fluidly connects the duct 40 with the plurality of gas supply openings 30. The plurality of gas supply openings 30 fluidly connect the associated gas supply duct 26 with the respective wafer boat chamber 24. This embodiment of the wafer boat cooldown device may also comprise at least one gas discharge duct 28, which may fluidly connect the bottom plate openings 36 with the plurality of gas discharge openings 32. The plurality of gas discharge openings 32 fluidly connect the associated gas discharge duct 28 with the respective wafer boat chamber 24. The vertically extending wall structure 22 may bound at least one vertically extending gas supply channel thus forming the gas supply duct 26. The vertically extending wall structure 22 may also bound at least one vertically extending gas discharge channel thus forming the at least one gas discharge duct 28.

Gas flow ducts may be round, but can have any kind of shape and cross-sections. In this preferred embodiment the gas supply ducts 26 and gas discharge ducts 28 are constructed as part of the vertically extending wall structure 22. The vertically extending wall structure 22 thus not only bounds the wafer boat chambers 24, but also the at least one gas supply channel and the at least one gas discharge channel. This vertically extending wall structure 22 thus provides a gas supply and discharge channel structure as well as a wafer boat chamber boundary in a very cost effective manner.

In an embodiment of the invention, one of the wafer boat chambers 24 may be associated with a wafer boat lift having a vertically moveable lift support member. The rotatable table 20 has a lift support opening 58 at each wafer boat position through which the lift support member can pass the rotatable table 20 for accommodating the lift support member in a space 60 between a lower side of the rotatable table 20 and an upper side of the bottom plate 18.

The wafer boat cooldown device 10 is configured to be positioned under a process chamber of a vertical batch furnace. The wafer boat lift can be used to move a wafer boat from the wafer boat cooldown device 10 to the process chamber and vice versa. The cooldown device 10 may have a top opening 76 through which the wafer boat lift can raise or lower the wafer boat to or from the process chamber.

Within the wafer boat cooldown device 10 the wafer boat is accommodated in a wafer boat chamber 24 of which the position can be altered by means of rotation of the rotatable table 20. However, the wafer boat lift is preferably connected to a stationary part of the wafer boat cooldown device 10.

When the wafer boat lift is not used, the lift support member can then be accommodated in the space 60 between the lower side of the rotatable table 20 and the upper side of the bottom plate 18, so that the rotatable table is freely rotatable to another index position.

In an embodiment of the invention, the wafer boat cooldown device 10 may further comprise a stationary support frame 62, and a rotatable table bearing 64. The rotatable table bearing 64 has an inner race which is fixedly connected to the duct 40. An outer race of the rotatable table bearing 64 is fixedly connected to the stationary support frame 62. The duct 40 is fixedly connected to the rotatable table 20 and forms a support for the rotatable table 20. The stationary support frame 62 may also be used as support frame for the bottom plate 18. The rotatable table bearing 64 could be, for instance, a ball bearing, which can give support in both axial and radial direction.

In an embodiment of the invention, the wafer boat cooldown device may further comprise a main housing 12 having a circumferential wall 14 and a top wall 16. The bottom plate 18 may be the bottom wall of the housing 12. The main housing 12 may further comprise at least one transfer opening 66 for transferring wafers to and from a wafer boat within one of the wafer boat chambers 24.

The transfer opening 66 provides a way for receiving the wafers to be treated and discharging the treated wafers. A wafer-handling robot may be placed outside the transfer opening 66 for the actual transferring of the wafers.

In an embodiment of the invention, the duct 40 is fixedly connected to the rotatable table 20 and rotates with the rotatable table 20. A first gas seal 68 may be provided between the rotatable duct 40 and the bottom plate 18. A second gas seal 70 may be provided between the rotatable duct 40 and the recirculation channel 48.

The first gas seal 68 may be substantially annular and may provide a substantially gas tight connection between the rotating duct 40 and the stationary bottom plate 18. The second gas seal 70 may also be substantially annular and may provide a substantially gas tight connection between the rotating duct 40 and the stationary recirculation channel 48. In this embodiment the duct 40 may be used to support the rotatable table 20.

In an embodiment of the invention, the first gas seal 68 and the second gas seal 70 are the only two gas seals present in the wafer boat cooldown device 10 for creating a gas tight connection between the rotating parts of the wafer boat cooldown device 10 and the stationary parts of the wafer boat cooldown device 10.

In view of the fact that gas seals are parts which may require replacement when the cooldown device 10 is serviced, it is beneficial that the number of gas seals present in the cooldown device 10 between rotating and stationary parts is as low as possible, preferably just two. It will be clear that such a low number of gas seals also minimizes the chance of leakage of the gas.

In an embodiment of the invention, the gas supply area of each wafer boat chamber 24 is provided with a filter assembly 72 so that gas supplied via the plurality of gas supply openings 30 to the respective wafer boat chambers 24 must pass said filter assembly 72. The filter assembly 72 associated with a wafer boat chamber 24 is provided to supply said wafer boat chamber 24 with clean gas.

In an embodiment of the invention, the rotatable table 20 may have three wafer boat positions with corresponding wafer boat chambers 24. The rotatable table 20 may be indexable over angles of 120°. A first index position of the wafer boat cooldown device 10 may be a load/receive position for loading the wafer boat vertically from the wafer boat chamber 24 that is in the first index position into the process chamber and/or for receiving the wafer boat from the process chamber in the wafer boat chamber 24 that is in the first index position. A second index position of the wafer boat cooldown device 10 may be a cooldown position. A third index position of the wafer boat cooldown device 10 may be a transfer position for transferring wafers to and from the wafer boat that is accommodated in the wafer boat chamber 24 that is in the third index position.

A rotatable table 20 that is rotatable between a number of index positions can also be called an index table. Such a table, can rotate in discrete and substantially equal steps. The amount of steps define the amount of index positions of the cooldown device 10. The rotating table 20 also defines the number of wafer boat positions. In this embodiment, the three index positions have three distinct objectives. Wafers accommodated in wafer boats will pass though all three positions. First the wafers will be placed in the wafer boat in the third index position. When the wafer boat is loaded, the rotatable table will rotate and the wafer boat chamber 24, with wafer boat loaded with unprocessed wafers, will be placed in the first index position. From there, the wafer boat will be loaded to the process chamber of the vertical furnace for processing the wafers. After processing in the process chamber, the wafer boat will be lowered and received in the wafer boat chamber 24 in the first index position. Subsequently, the rotatable table will rotate and the wafer boat chamber 24, with the hot wafer boat and wafers, will be placed in the second index position. The function of the second index position is cooling down the wafers and the wafer boat that is positioned in second index position. Finally, the rotatable table 20 will rotate again and the wafer boat chamber 24, with the wafer boat, will be placed again in the third index position. The now treated wafers can be unloaded from the wafer boat and new wafers can be loaded.

Finally, the present disclosure provides vertical batch furnace assembly comprising a process chamber for processing wafers accommodated in a wafer boat and comprising a wafer boat cooldown device 10 according to the present invention. The wafer boat cooldown device 10 is positioned under the process chamber. The vertical batch furnace assembly also comprises a vertical wafer boat lift assembly configured to transfer a wafer boat from the wafer boat cooldown device 10 to the process chamber and vice versa. The vertical batch furnace assembly may comprise multiple process chambers and may accordingly have multiple wafer cool down devices 10 associated with said process chambers.

Such a vertical batch furnace assembly has the advantages of the wafer boat cooldown device according to the invention which are described in the summary section and which advantages are considered to be repeated here by reference.

The various embodiments which are described above may be used implemented independently from one another and may be combined with one another in various ways. The reference numbers used in the detailed description and the claims do not limit the description of the embodiments nor do they limit the claims. The reference numbers are solely used to clarify.

LEGEND

10—wafer boat cooldown device
12—main housing
14—circumferential wall (of the main housing)
16—top wall (of the main housing)
18—bottom plate
20—rotatable table
22—vertically extending wall structure
24—wafer boat chamber
26—gas supply duct
28—gas discharge duct
30—gas supply openings
32—gas discharge openings
34—central gas opening
36—bottom plate opening
40—duct
42—plenum chamber housing
44—plenum chamber
46—plenum chamber opening
48—recirculation channel
50—gas blower
52—gas/liquid heat exchanger
54—bottom wall
56—heat exchanger housing
58—lift support opening
60—space
62—stationary support
64—rotatable table bearing
66—transfer opening
68—first gas seal
70—second gas seal
72—filter assembly
74—blocking wall
76—process chamber opening
L—central vertical axis

The invention claimed is:

1. A wafer boat cooldown device, configured to be positioned under a process chamber of a vertical batch furnace for processing wafers accommodated in a wafer boat, wherein the wafer boat cooldown device comprises:
a bottom plate;
a rotatable table comprising at least two wafer boat positions for supporting the wafer boat, the rotatable table being rotatable above the bottom plate around a central vertical axis; and
a vertically extending wall structure mounted on the rotatable table and creating, at each wafer boat position, a vertically extending wafer boat chamber,
wherein the vertically extending wall structure comprises:
a gas supply area comprising a plurality of gas supply openings; and
a gas discharge area comprising a plurality of gas discharge openings,
wherein the wafer boat cooldown device further comprises:
a duct which extends through a central gas opening in the bottom plate and is in fluid communication with the plurality of gas supply openings or the plurality of discharge openings,
wherein the bottom plate has a number of bottom plate openings which, when the rotatable table is in one of a number of index positions, are in fluid communication with the plurality of gas supply openings or the plurality of discharge openings,
wherein the wafer boat cooldown device further comprises:
a plenum chamber housing having plenum chamber walls which create a plenum chamber which extends under the bottom plate, at least partially around the duct, wherein the number of bottom plate openings in the bottom plate are in fluid communication with the plenum chamber, and wherein the plenum chamber has at least one plenum chamber opening;
a recirculation channel extending from the at least one plenum chamber opening to the duct and comprising at least one gas blower; and
at least one gas/liquid heat exchanger positioned in the plenum chamber.

2. The wafer boat cooldown device according to claim 1, wherein the at least one gas/liquid heat exchanger is configured for cooling gas which is discharged from at least one of the vertically extending wafer boat chambers.

3. The wafer boat cooldown device according to claim 1, wherein the plenum chamber housing includes at least one heat exchanger housing, wherein the at least one gas/liquid heat exchanger is accommodated in an associated one of the at least one heat exchanger housing, and wherein the at least one plenum chamber opening is provided in the at least one heat exchanger housing, so that gas which is discharged from at least one of the vertically extending wafer boat chambers flows along the at least one gas/liquid heat exchanger when flowing to the recirculation channel or to the number of bottom plate openings.

4. The wafer boat cooldown device according to claim 3, wherein the the at least one heat exchanger housing includes two heat exchanger housings, wherein each of the two heat exchanger housings accommodates a gas/liquid heat exchanger, and wherein each of the two heat exchanger housings is provided with one of said at least one plenum chamber openings.

5. The wafer boat cooldown device according to claim 1, wherein the plurality of gas supply openings are distributed in the vertically extending wall structure at least along a vertical direction over substantially an entire height of the vertically extending wall structure.

6. The wafer boat cooldown device according to claim 1, wherein the plurality of gas discharge openings are distributed in the vertically extending wall structure at least along a vertical direction over substantially an entire height of the vertically extending wall structure.

7. The wafer boat cooldown device according to claim 1, wherein for each wafer boat chamber the gas supply area is opposite the gas discharge area, so that gas supplied via the plurality of gas supply openings to the respective wafer boat chamber substantially horizontally crosses the wafer boat chamber when flowing to the plurality of gas discharge openings of the associated wafer boat chamber.

8. The wafer boat cooldown device according to claim 1, further comprising:
a gas supply duct, which fluidly connects either the duct or the bottom plate openings with the plurality of gas supply openings, the plurality of gas supply openings fluidly connecting the associated gas supply duct with the respective vertically extending wafer boat chamber; and
a gas discharge duct, which fluidly connects the other one of either the duct and the bottom plate openings with the plurality of gas discharge openings, the plurality of gas discharge openings fluidly connecting the associated gas discharge duct with the respective vertically extending wafer boat chamber.

9. The wafer boat cooldown device according to claim 8, wherein the vertically extending wall structure additionally bounds at least one vertically extending gas supply channel thus forming the gas supply duct, and wherein the vertically extending wall structure bounds at least one vertically extending gas discharge channel thus forming the gas discharge duct.

10. The wafer boat cooldown device according to claim 1, wherein one of the vertically extending wafer boat chambers is associated with a wafer boat lift having a vertically moveable lift support member, wherein the rotatable table has a lift support opening at each wafer boat position through which the lift support member can pass the rotatable table for accommodating the lift support member in a space between a lower side of the rotatable table and an upper side of the bottom plate.

11. The wafer boat cooldown device according to claim 1, further comprising:
a stationary support frame; and
a rotatable table bearing having an inner race which is fixedly connected to the duct, and having an outer race which is fixedly connected to the stationary support frame,
wherein the duct is fixedly connected to the rotatable table and forms a support for the rotatable table.

12. The wafer boat cooldown device according to claim 1, further comprising a main housing having a circumferential wall and a top wall, wherein the bottom plate forms a bottom wall of the main housing.

13. The wafer boat cooldown device according to claim 12, wherein the main housing further comprises at least one transfer opening for transferring wafers to and from a wafer boat within one of the vertically extending wafer boat chambers.

14. The wafer boat cooldown device according to claim 1, wherein the duct is fixedly connected to the rotatable table, wherein a first gas seal is provided between the duct and the bottom plate, and wherein a second gas seal is provided between the duct and the recirculation channel.

15. The wafer boat cooldown device according to claim 14, wherein the first gas seal and the second gas seal are the only two gas seals present in the wafer boat cooldown device for creating a gas tight connection between rotating parts of the wafer boat cooldown device and stationary parts of the wafer boat cooldown device.

16. The wafer boat cooldown device according to claim 1, wherein the gas supply area of each vertically extending wafer boat chamber is provided with a filter assembly so that gas supplied via the plurality of gas supply openings to the respective vertically extending wafer boat chamber must pass said filter assembly.

17. The wafer boat cooldown device according to claim 1, wherein the rotatable table has three wafer boat positions with corresponding vertically extending wafer boat chambers, wherein the rotatable table is indexable over angles of 120°,
wherein a first index position of the wafer boat cooldown device is a load/receive position for loading the wafer boat vertically from the vertically extending wafer boat chamber that is in the first index position into the process chamber and/or for receiving the wafer boat from the process chamber in the vertically extending wafer boat chamber that is in the first index position,
wherein a second index position of the wafer boat cooldown device is a cooldown position, and wherein a third index position of the wafer boat cooldown device is a transfer position for transferring wafers to and from the wafer boat that is accommodated in the vertically extending wafer boat chamber that is in the third index position.

18. A vertical batch furnace assembly comprising:

a process chamber for processing wafers accommodated in a wafer boat;

a wafer boat cooldown device according to any one of the previous claim 1, wherein the wafer boat cooldown device is positioned under the process chamber; and a vertical wafer boat lift assembly configured to transfer a wafer boat from the wafer boat cooldown device to the process chamber and vice versa.

\* \* \* \* \*